United States Patent
Fukui et al.

(10) Patent No.: US 6,245,628 B1
(45) Date of Patent: Jun. 12, 2001

(54) METHOD OF MANUFACTURING A RESISTOR IN A SEMICONDUCTOR DEVICE

(75) Inventors: Takeshi Fukui; Hidetoshi Furukawa, both of Suita; Daisuke Ueda, Ibaraki, all of (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/031,039

(22) Filed: Feb. 26, 1998

(30) Foreign Application Priority Data

Feb. 27, 1997 (JP) .................................................. 9-043234

(51) Int. Cl.⁷ ................................................. H01L 21/265
(52) U.S. Cl. .......................... 438/385; 257/536; 257/571
(58) Field of Search .................................. 438/385, 238, 438/384, 167, 172, 383, 381, 382, 396, 397, 399; 257/543, 350, 280, 20, 284, 359, 380, 536, 571; 338/195, 309; 357/22; 29/571

(56) References Cited

U.S. PATENT DOCUMENTS

| | | | |
|---|---|---|---|
| 3,860,465 | * | 1/1975 | Matzner et al. ........................... 156/8 |
| 4,001,762 | * | 1/1977 | Aoki et al. ............................. 338/309 |
| 4,104,085 | * | 8/1978 | Zandveld ............................... 148/1.5 |
| 4,119,440 | * | 10/1978 | Hile ....................................... 148/1.5 |
| 4,160,984 | * | 7/1979 | Ladd, Jr. et al. ........................ 357/22 |
| 4,191,938 | * | 3/1980 | Gow, 3rd et al. .................... 338/195 |
| 4,418,469 | * | 12/1983 | Fujita ................................. 29/577 C |
| 4,583,107 | * | 4/1986 | Clarke .................................... 357/22 |
| 4,637,126 | * | 1/1987 | Lightstone ............................. 29/572 |
| 4,679,298 | * | 7/1987 | Zuleeg et al. ........................... 29/571 |
| 4,742,021 | * | 5/1988 | Burnham et al. .................... 438/328 |
| 4,921,814 | * | 5/1990 | Ishikawa et al. ...................... 438/167 |
| 5,081,439 | * | 1/1992 | Natzle et al. .......................... 338/195 |
| 5,089,427 | * | 2/1992 | Schoenberg ........................... 438/545 |
| 5,105,242 | * | 4/1992 | Fujihara et al. ........................ 357/22 |
| 5,330,936 | * | 7/1994 | Ishitani ................................. 438/791 |
| 5,468,672 | * | 11/1995 | Rosvold ................................ 438/385 |
| 5,496,762 | * | 3/1996 | Sandhu et al. ........................ 438/384 |
| 5,525,831 | * | 6/1996 | Ohkawa et al. ...................... 257/543 |
| 5,585,302 | * | 12/1996 | Li ......................................... 438/384 |
| 5,602,408 | * | 2/1997 | Watanabe et al. .................... 257/350 |
| 5,622,884 | * | 4/1997 | Liu ........................................ 438/238 |
| 5,679,593 | * | 10/1997 | Miller, Jr. et al. .................... 438/210 |
| 5,796,131 | * | 8/1998 | Nakano et al. ....................... 257/284 |
| 5,808,332 | * | 9/1998 | Kohno et al. ......................... 257/280 |
| 5,830,792 | * | 11/1998 | Tseng ................................... 438/254 |
| 5,834,356 | * | 11/1998 | Bothra et al. ......................... 438/384 |
| 5,837,570 | * | 11/1998 | Asano ................................... 438/172 |
| 5,886,373 | * | 3/1999 | Hosogi ................................. 257/284 |
| 5,895,250 | * | 4/1999 | Wu ....................................... 438/396 |
| 5,900,641 | * | 5/1999 | Hara et al. .............................. 257/20 |
| 5,942,772 | * | 8/1999 | Nishii et al. .......................... 257/192 |
| 5,946,572 | * | 8/1999 | Terasawa .............................. 438/270 |
| 5,976,944 | * | 11/1999 | Czagas et al. ........................ 438/382 |

FOREIGN PATENT DOCUMENTS

| | | | | |
|---|---|---|---|---|
| 113820 | * | 9/1974 | (DE) | ................................ H01C/7/00 |
| 401155601A | * | 6/1989 | (JP) | .............................. H01C/17/06 |

* cited by examiner

*Primary Examiner*—Olik Chaudhuri
*Assistant Examiner*—Anh Duy Mai
(74) *Attorney, Agent, or Firm*—McDermott, Will & Emery

(57) ABSTRACT

A resistive area 7 is formed selectively on a semi-insulating substrate 1, and ohmic electrodes 10 are formed on both ends of the resistive area. Then a photo resist 14 having an opening 13 between the electrodes 10 is so formed as not completely across the resistive area 7. A desirable resistance value is thus obtained by removing the resistance area 7 by etching through the opening 13 gradually.

13 Claims, 4 Drawing Sheets

METHOD OF MANUFACTURING A RESISTOR IN A SEMICONDUCTOR DEVICE

FIELD OF THE INVENTION

The present invention relates to a method of manufacturing a resistor in a semiconductor device formed on a semi-insulating substrate, and more specifically relates to a method of forming a resistor having an adjustable resistance value.

BACKGROUND OF THE INVENTION

In a conventional forming method of a resistor between electrodes, a photo-resist having an opening for adjusting a resistance value is formed on a resistive area. Through the opening, the resistive area is etched so that a desirable resistance value is obtained by monitoring the resistance value.

The above conventional manufacturing method is described by referring to the cross sections in FIG. 3(A1) through FIG. 3(F1) and the plan views in FIG. 3(A2) through FIG. 3(F2).

First, as shown in FIG. 3(A1) and FIG. 3(A2), a photo-resist 3 having an opening 2 is formed on a semi-insulating substrate 1 such as GaAs, then an ion-plantation of an impurity is conducted into the semi-insulating substrate 1 in order to form a resistive contact area 4 of high impurity concentration.

Next, as shown in FIG. 3(B1) and FIG. 3(B2), the photo resist is removed, and a new photo resist 6 having an opening 5 is formed on the semi-insulating substrate 1. Then, ions are planted into the semi-insulating substrate 1 in order to form a resistive area 7 of low impurity concentration.

As shown in FIG. 3(C1) and FIG. 3(C2), the photo-resist 6 is removed and a photo-resist 9 having an opening 8 for forming an electrode is formed on the semi-insulating substrate 1.

As shown in FIG. 3(D1) and FIG. 3(D2), after metallic film being formed, the photo resist 9 is removed, and an ohmic electrode 10 is formed by Lift-Off method.

As shown in FIG. 3(E1) and FIG. 3(E2), a photo-resist 12 having an opening 11 across the entire resistive area 7 is formed. The opening 11 is used for adjusting a resistance value. Then the resistive area 7 is etched, and the resistance value is adjusted by monitoring a value thereof in order to get a desirable resistance value.

Finally, as shown in FIG. 3(F1) and FIG. 3(F2), the photo-resist 12 is removed in order to form a resistor between electrodes, of which resistance value has been adjusted to a desired value.

In the above method, when adjusting the resistance value by etching the resistive area 7 through the opening 11 which is across the entire resistive area 7 with monitoring the resistance value, the resistance value sharply increases after a certain period of etching, as shown in FIG. 4. Accordingly, if an etching is slightly overtimed, the etching would penetrate the resistive area 7, whereby the resistance value becomes infinite.

The etching time for adjusting the resistance value within a tolerance of a designed value, as shown in FIG. 4, is on the order of seconds. Therefore, it is difficult to control the resistance value, and the wide range of the resistance values resulting from the foregoing process contributes to lowering the yield rate.

As a result, there is a need to be able to control the resulting resistance value of the resistor formed between electrodes as described above so as to increase the yield rate when forming the resistance in an integrated circuit.

SUMMARY OF THE INVENTION

The present invention aims to improve controllability of a resistance value of a resistor formed between electrodes.

A method of forming a resistor according to the present invention comprises the following steps:
 (a) Form a resistive area selectively on a semi-insulating substrate by ion-plantation or diffusion of an impurity,
 (b) Form electrodes on both ends of the resistive area,
 (c) Form a film having an opening on the resistive area so that the opening does not completely cross over the resistive area,
 (d) Etch the resistive area exposed to the opening in order to adjust a resistance value of the resistive area.

A user can prevent a resistance value from reaching infinity, and have more deviation with regard to etching time (etching tolerance) through these steps, even if a user etches the resistive area as deep as penetrating thereof. As a result, the controlability of the resistance value as well as the yield rate of the resistor is increased.

DESCRIPTION OF THE PREFERRED EMBODIMENT

Figure 1:
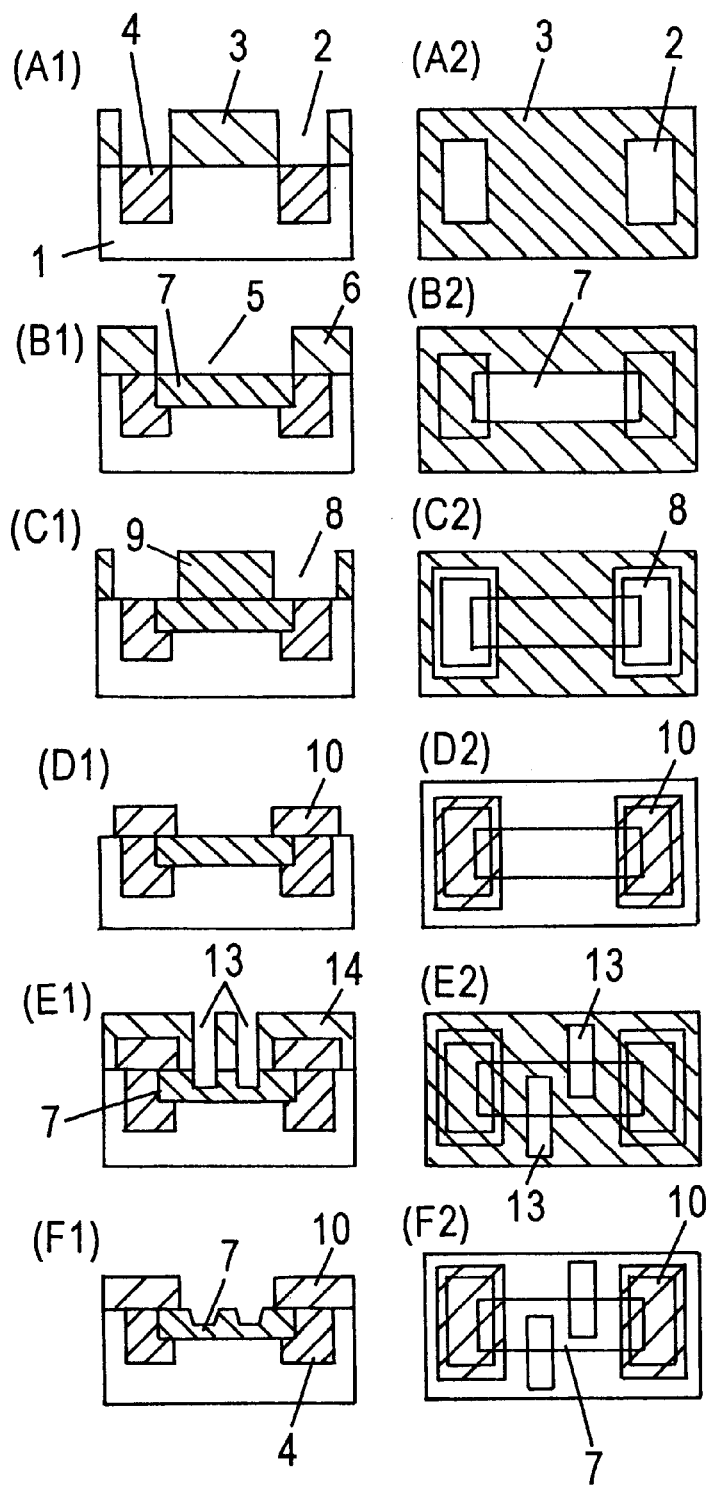
FIG. 1 (A1)–FIG. 1(F1) and FIG. 1(A2)–FIG. 1(F2) are cross sections and plan views depicting a method of forming a resistor according to an exemplary embodiment of the present invention.

A method of forming a resistor according to the present invention is described by referring to the cross sections shown in FIG. 1(A1)–FIG. 1(F1) and plan views shown in FIG. 1(A2)–FIG. 1(F2). This method employs a resistance value adjusting method using a photo resist pattern not completely across a resistive area.

First, as shown in FIG. 1(A1) and FIG. 1(A2), form a photo resist 3 having an opening 2 on a semi-insulating substrate made of a semiconductor such as GaAs. Then, form a resistance contact area 4 of high impurity concentration on the semi-insulating substrate 1 by ion-plantation or diffusion of an impurity.

Second, as shown in FIGS. 1(B1) and (B2), remove the photo resist 3, and on the semi-insulating substrate 1, form a new photo resist 6 having an opening 5 which is used for forming a resistive area. Then ion-plantation or diffusion is conducted to the semi-insulating substrate 1 by using the photo resist 6 as a mask in order to form a resistive area 7 of low impurity concentration.

After that, as shown in FIGS. 1(C1) and (C2), remove the photo resist 6, and on the semi-insulating substrate 1, form a new photo resist 9 having openings 8. The openings 8 are used for forming electrodes.

Third, as shown in FIGS. 1(D1) and (D2), form metallic film made of AuGeNi/Au, then remove the photo resist 9, and form ohmic electrodes 10 by Lift-Off method.

Fourth, as shown in FIGS. 1(E1) and (E2), on the semi-insulating substrate 1, form a photo resist 14 having two openings 13 not entirely across the resistive area 7. The openings 13 are used for adjusting a resistance value. Then, provide the resistive area 7 with etching through the openings 13 by dipping the semi-insulating substrate 1 into etching solution. Take out the semi-insulating substrate 1 from the etching solution, and measure a resistance value whether it reaches to a desirable value by touching a probe to the electrode through an opening. When it does not reach to the desirable value, provide etching again and measure the resistance value. Repeat this operation until the resistance value is adjusted to reach the desirable value. It is noted that any suitable dry etch process may be utilized to etch the resistive area 7.

Finally, as shown in FIGS. 1(F1) and (F2), remove the photo resist 14, and then form a resistor between the electrodes. The resistance value of the resistor has been thus adjusted.

Figure 2:
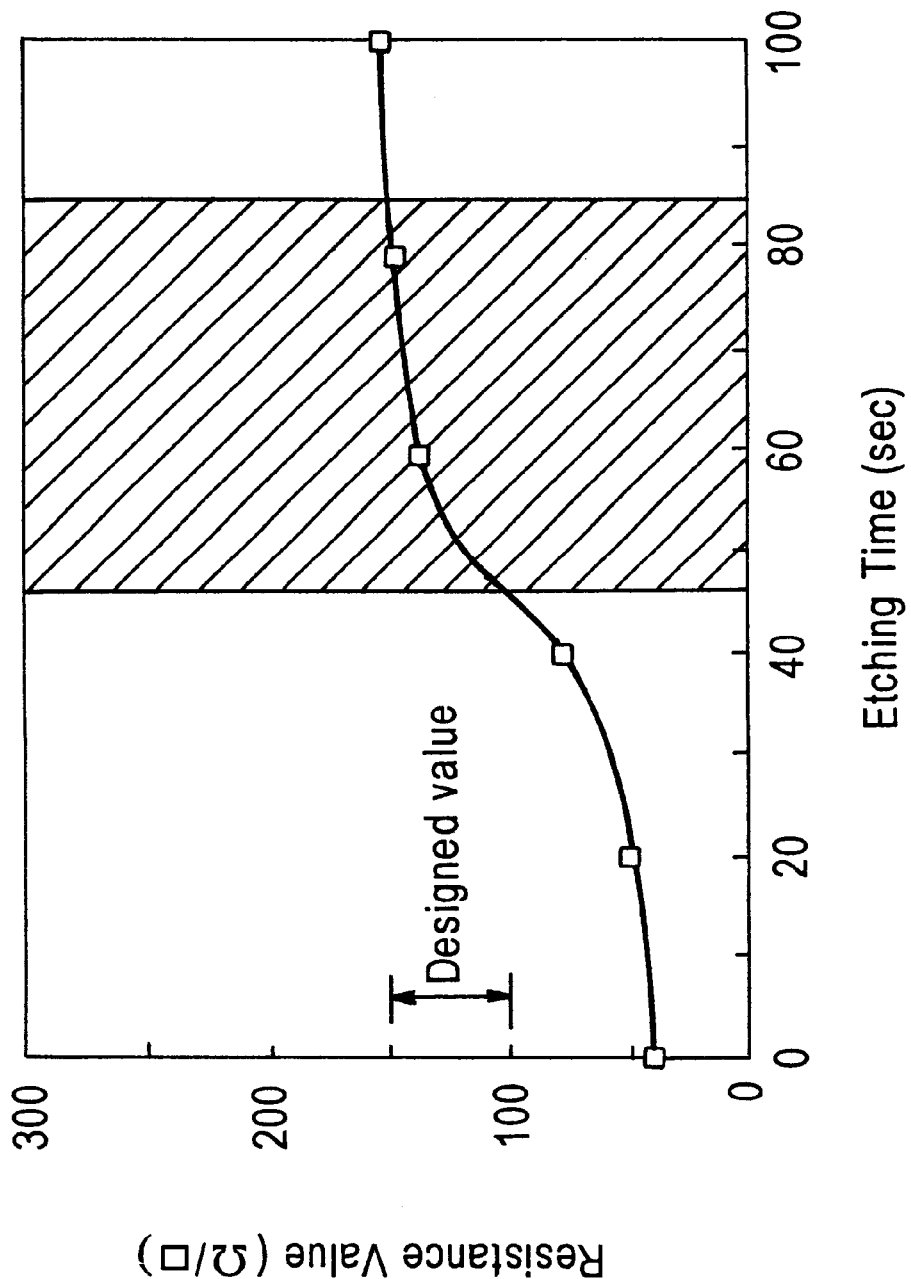
FIG. 2 depicts a change of a sheet resistance value with regard to an etching time according to the embodiment of the present invention.
Figure 3:
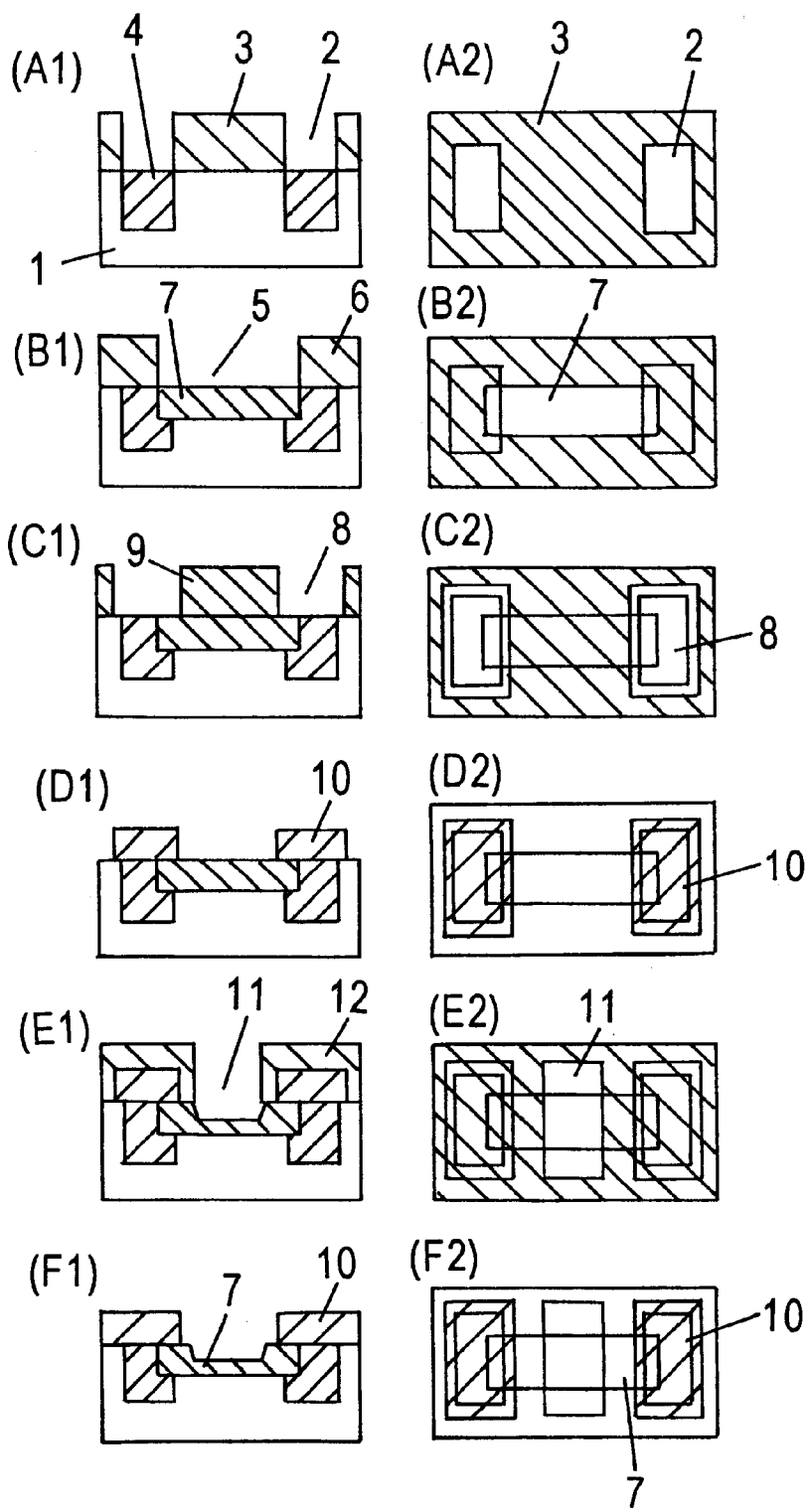
FIG. 3(A1)–FIG. 3(F1) and FIG. 3(A2)–FIG. 3(F2) are cross sections and plan views depicting a conventional method of forming a resistor.
Figure 4:
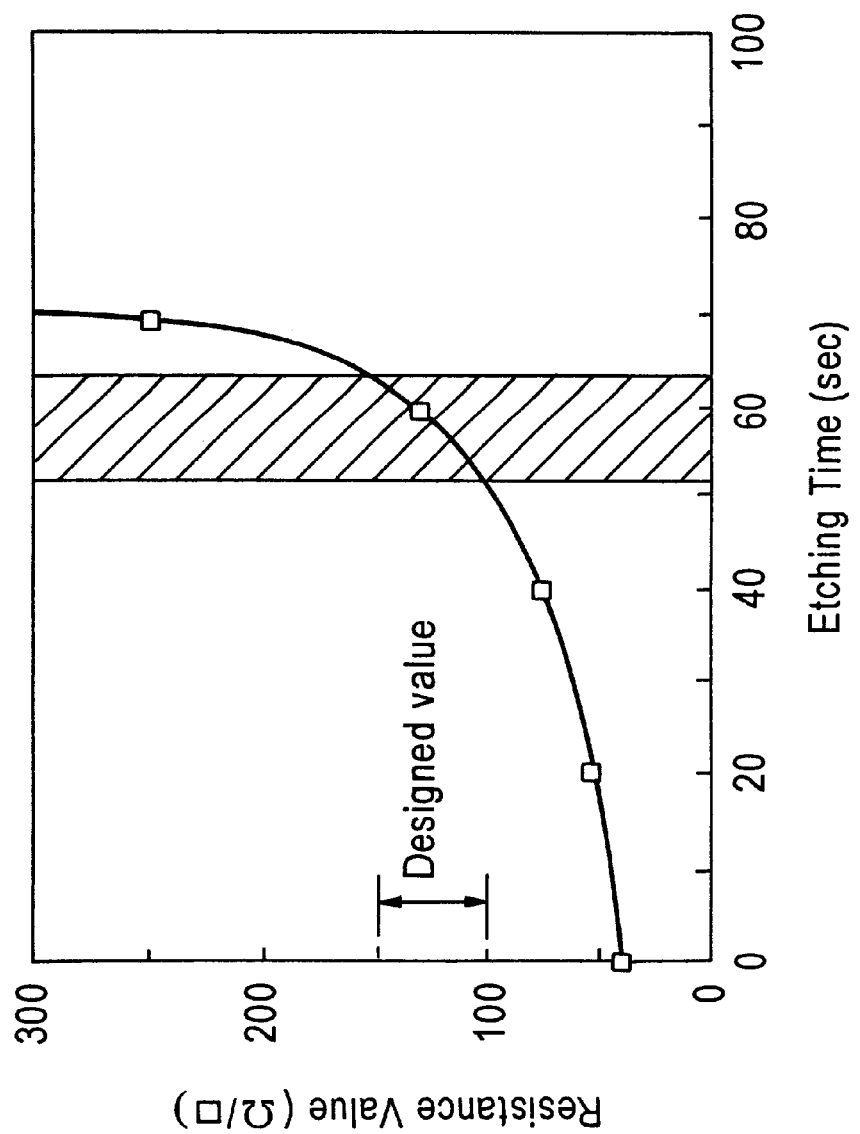
FIG. 4 depicts a change of a sheet resistance value with regard to an etching time in the conventional method.

FIG. 2 shows a relation between the etching time and a sheet resistance value obtained by the method of the present invention. As FIG. 2 depicts, the method of forming the resistor according to the present invention features a decreased change rate of resistance value with regard to the etching time than that of the conventional forming method shown in FIG. 4. Therefore, as the shaded portion in FIG. 2 shows, the etching time for adjusting the resistance value within a designed value becomes longer than that of the conventional method. Thus, even if the etching time is slightly longer than the scheduled time, the resistance value still stays within the designed value. As a result, the resistance value has a narrower dispersion, and the yield rate of the resistor is increased.

If an excessive etching would penetrate the resistive area, a resistance value is prevented from reaching to infinite, whereby the resistance value can be adjusted more safely and easily than by the conventional method.

In this embodiment, two openings for adjusting the resistance value are provided. As such, the openings of an even number can maintain a shape of the resistor symmetrically, which balances the resistor per se well. However, a number of openings may be an odd number. In this case, the shape of the resistor becomes asymmetric, but no changes are expected in the above advantages.

According to the resistor forming method of the present invention, the following two advantages are realized thanks to (a) enough time in etching for adjusting a resistance value, and (b) an etching for adjusting a resistance value, which prevents the resistance value from reaching to infinite due to an etching penetration through the resistive area:

(1) the adjustment of the resistance value becomes easier, and
(2) the yield rate of the resistor can be increased.

What is claimed is:

1. A method of manufacturing a semiconductor device comprising the steps of;
   forming a resistive area having a long direction and a short direction on a semi-insulating substrate,
   forming a film having a plurality of openings on said resistive area, each of said plurality of openings extending along said short direction from either a first side or a second opposing side of said resistive area and not completely across said resistive area in said short direction, wherein at least two of said plurality of openings extend from said first and second sides in an alternating manner, and
   etching an exposed portion of said resistive area through said plurality of openings.

2. The method of claim 1, wherein said resistive area is formed by ion-implantation of an impurity.

3. The method of claim 1, wherein said resistive area is formed by diffusion of an impurity.

4. The method of claim 1, further comprising the step of forming an electrode on both ends of said resistive area.

5. The method of claim 1, wherein said etching of said exposed portion of said resistive area is performed using a dry etch process.

6. The method of claim 1, wherein said etching of said exposed portion of said resistive area is performed using a wet etch process.

7. The method of claim 1, wherein said etching of said exposed portion of said resistive area is performed until said resistive area exhibits a desired resistive value.

8. A resistor formed in a semiconductor substrate, said resistor comprising:
   an impurity concentration area formed in said semiconductor substrate, said impurity concentration area operative as a resistive area, said impurity concentration area having a predetermined width, length and depth;
   said impurity concentration area having a plurality of openings therein, each of said plurality of openings extending along a direction of said width from either a first side or a second opposing side of said resistive area only partially across an upper surface of said impurity concentration area in said direction of said width, wherein at least two of said plurality of openings extend from said first and second sides in an alternating manner.

9. The resistor of claim 8, wherein said opening extends downwardly into said impurity concentration area in a substantially vertical direction such that said opening never spans the entire width of said impurity concentration area.

10. The resistor of claim 8, further comprises an electrode formed on each end of said impurity concentration area.

11. The method of manufacturing a semiconductor device as recited in claim 1, further including the step of removing said film after said etching step.

12. The method of manufacturing a semiconductor device as recited in claim 1, wherein said first and second sides are disposed at edges of said resistive layer.

13. The resistor formed in a semiconductor substrate as recited in claim 8, wherein said first and second sides are disposed at edges of said resistive layer.

* * * * *